United States Patent [19]

Lan et al.

[11] Patent Number: 4,780,174

[45] Date of Patent: Oct. 25, 1988

[54] DISLOCATION-FREE EPITAXIAL GROWTH IN RADIO-FREQUENCY HEATING REACTOR

[76] Inventors: Shan-Ming Lan; Sung-Shan Jao, both of P.O. Box 3, Lung-Tan 32500, Taiwan

[21] Appl. No.: 938,440

[22] Filed: Dec. 5, 1986

[51] Int. Cl.$^4$ ............................................. H01L 21/205
[52] U.S. Cl. ...................... 156/610; 156/612; 156/613; 156/DIG. 64; 156/DIG. 93; 118/725; 118/728; 118/500; 118/503; 148/175; 427/86; 427/255; 427/248.1
[58] Field of Search ............... 156/612, 613, DIG. 64, 156/DIG. 93, 610; 118/725, 728, 500, 503; 148/175; 427/86, 255, 248.1

[56] References Cited

U.S. PATENT DOCUMENTS

| | | | |
|---|---|---|---|
| 3,436,255 | 4/1969 | Harris et al. | 118/725 |
| 3,539,759 | 11/1970 | Spiro et al. | 118/725 |
| 4,113,547 | 9/1978 | Katz et al. | 118/728 |

OTHER PUBLICATIONS

Kren, "IBM Technical Disclosure Bull.", vol. 7, (12) May 1965.
"Thermally Induced Dislocations in Silicon", Rai-Choudhury et al., J. Appl. Phys., vol. 40, 1969, pp. 4980-4982.
"Influence of Silicon Slice Curvature on Thermally Induced Stresses", Huff et al., J. Electrochem. Soc., vol. 118, 1971, pp. 143-145.
"Slip in Silicon Epitaxy", Bloem et al., J. Appl. Phys., vol. 43, 1972, pp. 1281-1283.
"Control of Slip in Horizontal Silicon Epitaxy with Profiled Susceptors", Goemans et al., J. Crystal Growth, vol. 31, 1975, pp. 308-311.
"The Reduction of Emitter-Collector Shorts in a High--Speed All-Implanted Bipolar Technology", Parrillo et al., IEEE Trans. on Electron Devices, vol. ED-28, No. 12, 1981, pp. 1508-1514.
"Low Dislocation Density RF-Heated Epitaxial Silicon", Robinson et al., J. Electrochem. Soc., vol. 129, 1982, pp. 2858-2860.

Primary Examiner—Asok Pal
Attorney, Agent, or Firm—Burns, Doane, Swecker & Mathis

[57] ABSTRACT

A method is described for solving the long-standing problem of the generation of slip lines and dislocations during epitaxial deposition onto monocrystalline substrates, chiefly silicon, in a radio-frequency heating reactor. The method involves inserting a pad wafer, which is of the same material and dimension as the substrate, into a flat-bottom recess and over a coaxial flat-bottom depression when on the upper side of the susceptor which allows uniform heating of the monocrystalline substrate. By proper adjustment of the depth thereby eliminating diameter of recess and depression respectively, the occurrence of a radial temperature gradient in the heated substrate can be minimized, and the slip line and the dislocation in the epitaxial deposited wafers up to given maximum dimensions.

4 Claims, 2 Drawing Sheets

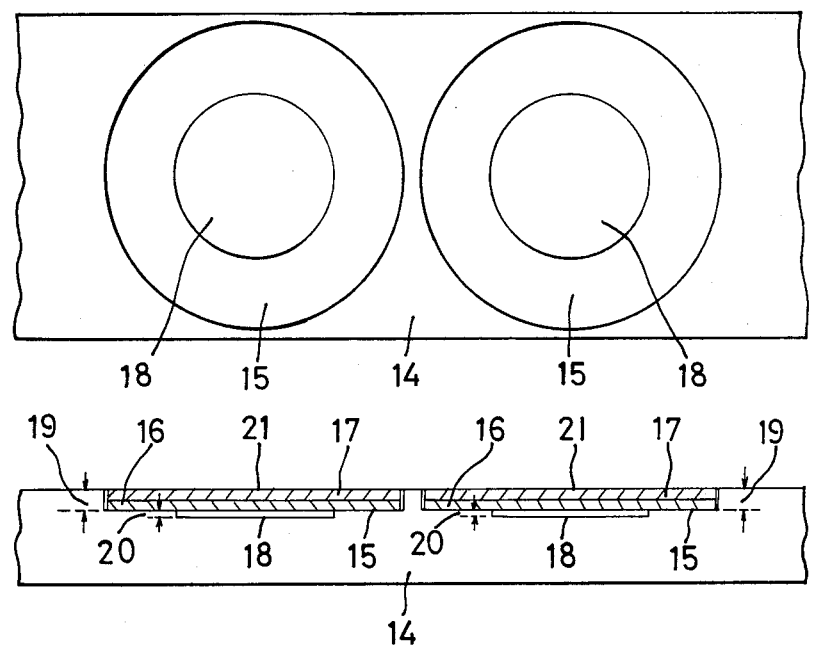
FIG. 3a
FIG. 3b
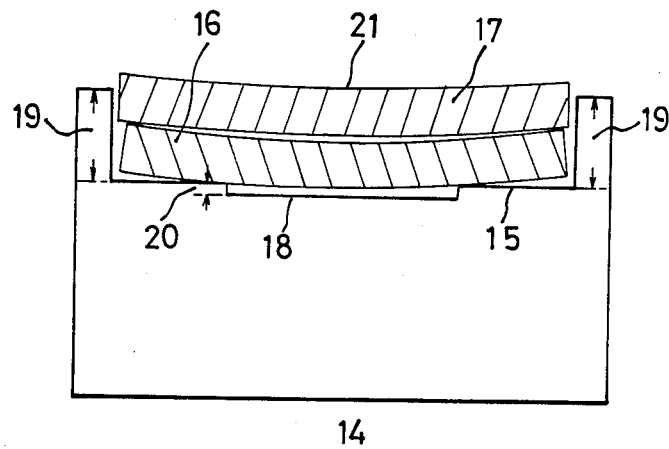
FIG. 4

DISLOCATION-FREE EPITAXIAL GROWTH IN RADIO-FREQUENCY HEATING REACTOR

BACKGROUND OF THE INVENTION

1. Field of the Invention

This invention relates to a method of depositing epitaxial layers on monocrystalline substrates and, more particularly, to a method of depositing silicon epitaxial layers on silicon wafers.

2. Description of the Prior Art

Epitaxial semiconductor materials, chiefly silicon, are widely used for the fabrication of bipolar integrated circuits and discrete/power devices. Recently, epitaxial silicon has also been applied to the fabrication of MOS devices for eliminating some serious circuit performance limitations, such as latch up in CMOS structures and soft errors in dynamic RAMs. Epitaxial silicon can significantly enhance circuit speed and improve MOS yield. Therefore, the silicon epitaxy has become an important technology in semiconductor industry. However, common defects occuring in silicon epitaxial layers are slip, dislocation, stacking fault, and saucer. The slip and dislocation defects are well known to be sinks for impurities, and to be the cause of diode leakage and emitter-collector short to deteriorate the performance of the devices fabricated from such wafers. Thus, the elimination or reduction of the defects has become an important object in the epitaxial process.

In a radio-frequency heating reactor, the substrate is heated only from the back-side by the susceptor causing an axial temperature gradient across the substrate. The front-to-rear temperature difference causes a differential expansion of the substrate. In effect, the substrate curls up on the susceptor surface. As a result of this, the temperature at the peripheral edge of the substrate will drop causing a further reduction in comparison to central portions of the substrate. These radial temperature gradients will produce sufficient internal stresses to create dislocations and slip lines in the substrate. In general, the slip lines and dislocations follow a typical pattern, originating at the perimeter and extending toward the substrate center. Furthermore, defects generated in the substrate will propagate through the deposited layers. The presence of these defects affects the quality and reduces the yield of the devices produced from such epitaxial wafers.

The conventional method for solving the problem of slip lines and dislocations is to put the substrate into a flat-bottom shallow recess on the upper side of the susceptor. The depth and size of the recess correspond approximating to the thickness and size of the substrate. In this manner, the side-wall of the recess can supply radiation energy to the peripheral edge of the substrate to reduce the radial temperature gradients in the substrate. The recess can partly reduce the density of defects. However it cannot inhibit the generation of slip lines and dislocations completely. Furthermore, several approaches for reducing the thermal gradients in the substrate had been provided which include flat-bottom depressions on the upper side of the graphite heater-(U.S. Pat. No. 3,436,255 1969), recesses on the lower side of the susceptor(U.S. Pat. No. 3,892,940 1975), an encircling ring around the rim of the substrates(U.S. Pat. No. 4,113,547 1978), and a spherical depressions on the upper side of the susceptor(J. Electrochem. Soc. 129, 2858, 1982). Those approaches did suppress the generation of slip lines and dislocations to a minimum, but had not given slip-free and dislocation-free epitaxial growth in a radio-frequency heating reactor.

Accordingly, the object of this invention is to provide a simple and highly efficient method of reducing the thermal gradients in the substrate to a minimum and giving slip-free and dislocation-free epitaxial growth in a radio-frequency heating reactor.

SUMMARY OF THE INVENTION

The uniqueness of this invention is its simple and highly efficient method for inhibiting the generation of slip lines and dislocations completely during epitaxial deposition process in a radio-frequency heating reactor. A pad wafer, which is of the same material and dimension with the substrate, is placed into a flat-bottom recess and over a coaxial flat-bottom depression on the upper side of the susceptor for uniformly heating of substrate. By properly adjusting the depth and diameter of the recess and depression respectively, the radial temperature gradients and thermal stresses in the substrate can be minimized, and slip-free and dislocation-free epitaxial growth can be obtained.

During the epitaxial deposition process at high temperature, typically about 1050° C. to 1250° C. for silicon, the depression apparently reduces the heat flow from the susceptor to the central portions of the substrate and gives a more uniform temperature profile across the substrate. At the same time, the pad wafer curls up on the susceptor because its back side is in contact with the susceptor directly. The bowed pad wafer behaves just like a spherical depression relative to the substrate. In effect, the insertion of the pad wafer can improve the thermal contact between the substrate edge and the pad wafer, again reduce again the heat flow from the pad wafer to the central portions of the substrate, and finally promote uniformly heating of the substrate. The pad wafer in accordance with this invention plays an important role to suppress the generation of slip lines and dislocations during epitaxial deposition process in radio-frequency heating reactor.

Semiconductor substrates are generally produced in nominal sizes from 3 inches(76.2 mms)to 6 inches(152.4 mms)in diameter, the recesses and the depressions on the upper side of the susceptor should be designed to match these standard sized substrates respectively for inhibiting the generation of slip lines and dislocations. The pad wafers in accordance with this invention are reusable.

BRIEF DESCRIPTION OF THE DRAWINGS

The invention and its objects and features will be apparent from the following description taken in conjunction with the accompanying drawing.

FIG. 3 is the top view(a)and vertical cross-sectional view(b)of an embodiment of a susceptor for epitaxial crystal growth in accordance with this invention.

FIG. 4 is a vertical cross-sectional model view of a pad wafer and a substrate mounting in the susceptor shown in FIG. 3 during the high temperature epitaxial deposition process in accordance with this invention.

DETAILED DESCRIPTION OF THE INVENTION

Figure 1:
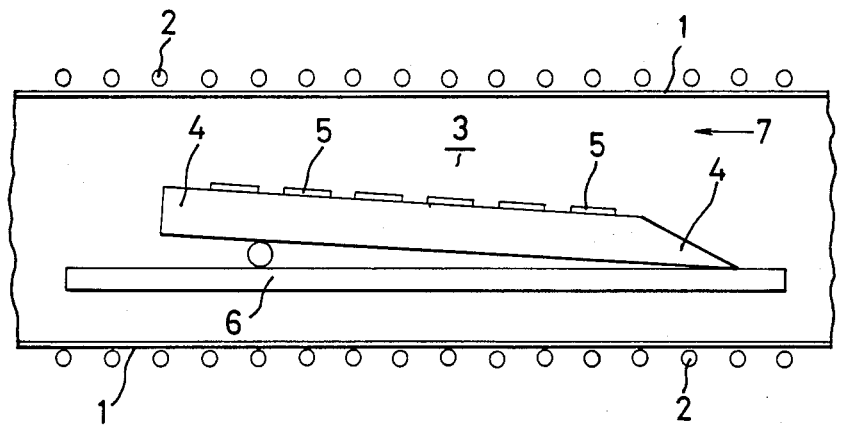
FIG. 1 is a longitudinal sectional view of a chemical vapor deposition reactor heated by radio-frequency induction.

The vapor-phase epitaxy is a very important technology in the semiconductor industry. For example, silicon single-crystal films are deposited on silicon monocrystalline substrates by the pyrolytic decomposition of silicon compound in gaseous form, subsequently, the epi-wafers are fabricated into devices. The process is generally performed in a reactor at an elevated temperature with the substrate held at a high temperature while mounted on susceptor. Referring to FIG. 1, 1 denotes a reaction tube, usually consisting of transparent quartz tube. A water-cooled power output coil 2 of the radio-frequency generator is arranged coaxially around the reaction tube 1. A plate-shaped susceptor 4, which typically is of graphite, is placed in the reaction chamber 3 and coupled with radio-frequency coil 2 closely. The susceptor 4 provides mechanical support for the substrates 5 and is the thermal energy source for the desired reaction temperature. The hot susceptor 4 is supported by a quartz frame 6 to prevent direct contact with the inside-wall of the reaction tube 1. With respect to the axis of the reaction tube 1, the susceptor 4 is provided in an inclined position of a few degrees as shown in FIG. 1. A series of monocrystalline silicon substrates 5 are mounted on the susceptor 4.

A typical conventional process for silicon epitaxy includes several steps. The air in the reaction chamber 3 is purged along the arrow sign 7 by a flow of hydrogen gas. The radio-frequency coil 2 is energized to heat the susceptor 4 up to the desired temperature. After thermal equilibrium is established in the reaction chamber 3, a hydrogen chloride etch as performed at a temperature of 1100°–1250° C. normally for 1–5 minutes. Then the temperature of the substrates is reduced to the growth temperature of 1050°–1200° C., which depends on the silicon compound used, with time allowed for stabilization and flushing of HCl as needed. Next, the vapor of chlorosilane:silicon tetrachloride, trichlorosilane, or dichlorosilane, and the dopant of diborine or phosphine are supplied in known manner with hydrogen, the epitaxial silicon layer being deposited on the substrates 5. After a time, which is sufficient to obtain the desired layer thickness, hydrogen carrier gas is flowed through, and then the reactor is cooled down to room temperature. On completion of the deposition process, the epi-wafers are removed from the reactor.

Figure 2A:
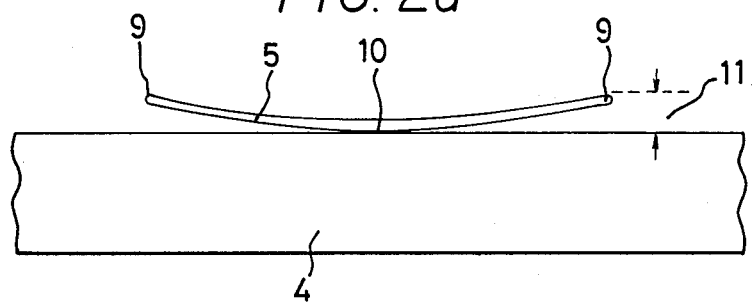
FIG. 2 is a diagrammatic vertical cross-sectional view of a portion of the conventional susceptor having a substrate heated thereon:(a)the substrate is laid on the susceptor directly and(b)the substrate is laid in the shallow recess on the upper side of the susceptor.
Figure 2B:
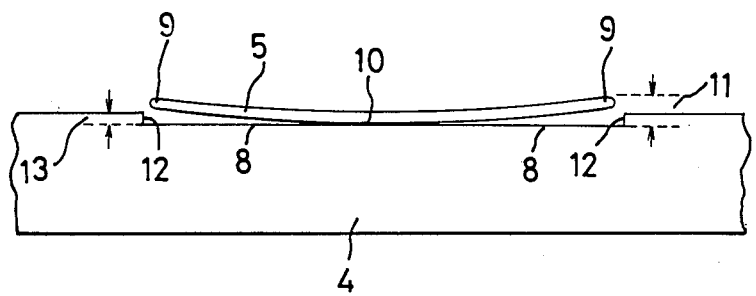

When the substrate 5 is laid directly on the plate-shaped susceptor 4 or in the flat-bottom shallow recess 8 on the upper side of the susceptor 4, it curls up on the susceptor surface during the epitaxial deposition process at high temperature as shown in FIG. 2. The bowing of substrate 5 is due to the axial temperature gradient across the substrate 5. In a radio-frequency heating reactor, the substrate 5 is heated only from the back-side by the susceptor 4 making an axial temperature gradient in the substrate 5. Owing to the bowing, the peripheral edge 9 of the substrate 5 is lifted slightly from the susceptor surface. This, in turn, causes worse thermal contact between the substrate peripheral edge 9 and the susceptor 4. Therefore the temperature will drop more at the edge nine to give a further bowing of the substrate 4. Therefore, the temperature of the substrate peripheral edge 9 will be lower than in the central portion 10 of the substrate. The bowing thus results in a radial temperature gradient in the substrate 5. The net effect is a large thermal stress, causing the creation of dislocations and slip lines in the substrate. The dislocations originate primarily at the peripheral edge of the substrate, where the thermal stress is highest, and extend toward the substrate center. The extent of deformation of the heated substrate is usually determined by the lifting distance 11, which depends on the diameter and thickness of the substrate and the temperature of the susceptor, particularly, on the diameter of the substrate. The larger the diameter, the higher the lifting distance 11. It means that the larger the diameter, the more dislocations and slip lines are created in the substrate after the epitaxial deposition process. When the substrate 5 is laid in the recess 8 of the susceptor 4 as shown in FIG.2(b), the lifting distance 11 is less than that of FIG.-2(a), because the side wall 12 of the recess 8 can supply radiation energy to the substrate peripheral edge 9 and reduce the radial temperature gradient somewhat. Usually, the recess depth 13 is equal to or less than the substrate thickness. If the recess depth 13 is more than the substrate thickness, it will give an uneven epitaxial growth on the substrate. The design of the flat-bottom shallow recess 8 does reduce the density of slip lines and dislocations, but it cannot inhibit the generation of these defects completely.

FIG. 3 shows an embodiment of a plate-shaped susceptor in accordance with this invention which allows zero slip line and dislocation epitaxial growth on monocrystalline substrates having a diameter of 3 inches (76.2 mms) and more. In order to facilitate understanding an invention of the embodiment, the susceptor which is destined for circular substrate of 3 inches (76.2 mm) in diameter and 0.40 mms in thickness, is used as an example. The susceptor 14 is graphite and has a thickness of 25 mm in which flat-bottom circular recesses 15 are provided on the upper side for laying the pad wafers 16 and the substrates 17. A flat-bottom circular depression 18 is provided under each recess 15 coaxially for reducing the heat flow from the susceptor 14 to the substrate center to give a more uniform temperature profile across the substrate 17. The diameter of the recesses 15 is about 0.2 mms larger than the overall diameter size of the substrates 17. The recess depth 19 is of 0.8 mms, which is the sum of the thicknesses of the pad wafer 16 and the substrate 17. The diameter of the depression 18 is approximately 35 mms to 50 mms. And the depression depth 20 is within the range of 0.10 mms to 0.30 mms. The center distance between most adjacent recesses is, for example, 80 mms. The machined susceptor 14 is subsequently given a cleaning, a high temperature baking, and silicon carbide coating before its use. The pad wafers 16 and the substrates 17, having a diameter of 76.2 mms. and a thickness of 0.40 mms, are arranged in the manner as shown in FIG. 3(b). The pad wafers 16 in accordance with this invention are the same material and dimension of the substrates 17, and are reusable. The substrates 17 were substantially free of dislocations and their surfaces were carefully cleaned and etched in the usual manner before mounting onto the susceptor 14. Referring again to FIG. 3, the susceptor 14, having the pad wafers 16 and the substrates 17 in the recesses 15, was loaded into the epitaxial reactor. The epitaxial deposition process was carried out in the usual fashion just likewise described above to produce an epitaxial layer on the substrate surface 21. On completion of the epitaxial deposition process, the epi-wafers were removed and the pad wafers were retained on the susceptor for reuse. The deposited epi-wafers upon examination were found to be completely slip-free and dislocation-free.

The geometric relation between the pad wafer 16 and the substrate 17, which are laid in the recess 15 on the upper side of the susceptor 14, during the epitaxial deposition process at high temperature, is shown in FIG. 4 in an exaggerated manner. The function of the depression 18 is to reduce the heat transfer from the susceptor 14 to the central portions of the pad wafer 16; accordingly it reduces the heat transfer from the pad wafer 16 to the central portions of the substrate 17. The reduction of the heat flow through the central parts of the substrate 17 will compensate for the temperature dropping at the peripheral portion of the substrate 17 relative to the temperature at the central portion of the substrate 17. During the epitaxial deposition process at high temperature, the back side of the pad wafer 16 is in contact with the susceptor 14, the pad wafer 16 bows upward in the recess on the upper side of the susceptor as shown in FIG. 4. The bowed pad wafer behaves just like a spherical depression relative to the substrate 17. The curvature of the pad wafer can be adjusted automatically with the temperature of the susceptor 14. In effect, the insertion of the pad wafer 16 and the addition of the depression 18 improves the thermal contact between the substrate peripheral edge and the pad wafer 16, and reduces the heat flow from the pad wafer 16 to the substrate 17 center, thereby promoting uniform heating of the substrate 17. The pad wafer 17 in accordance with this invention plays an important role to reduce the radial temperature gradient and consequential thermal stress to a minimum thereby inhibiting the generation of slip lines and dislocations completely in the substrate during epitaxial deposition process in a radio-frequency heating reactor. Furthermore, the pad wafers are the same as the substrate wafers, in accordance with this invention and are therefore reusable and easy to obtain so that it will not add the cost to the production of the epitaxial wafers.

According to the invention, the recess depth 19 at its optimized value is equal to the sum of the thicknesses of the pad wafer 16 and the substrate 17. If the recess depth 19 is quite a bit smaller than the optimized value, it does not inhibit the generation of the slip lines and dislocations completely in the epi-wafers. If the recess depth 19 is quite a bit larger than the optimized value, although it inhibits the generation of the slip lines and dislocations, it gives an uneven equitaxial growth in the substrate 17. The dimension of the flat-bottom circular depression 18 also has an optimized value, specifically, the depth is from 0.10-0.30 mm, and the diameter is between one half and two thirds the substrate diameter. Beyond these optimized values of the depression dimension, the susceptor can not completely suppress the generation of the slip lines and dislocations in the substrate 17.

At the present time, semiconductor wafers are generally produced in nominal diameter size range of from 3 to 6 inches. Although the susceptor in accordance with this invention has been described for dislocation-free epitaxial growth on a 3 inch substrate, the larger substrates, for example, 4 inches, 5 inches, and 6 inches in diameter, can be used, requiring only that the depth and the diameter of the flat-bottom circular depressions 18 and the recesses 15 on the upper side of the susceptor 14 are adjusted to their optimized values.

In the special case of epitaxy for smaller circular substrates 17 having a diameter of 2 inches (50.8 mms) and less, the slip-free and dislocation-free epitaxy growth can be achieved by only inserting the pad wafer 16 into the recess without the presence of the flat-bottom circular depressions 18. In this situation, the thermal stress existing in smaller circular substrates, during the epitaxial deposition process at high temperature is below the critical value of the thermal stress which start the generation of slip-lines and dislocations.

Although the substrate in accordance with this invention has been described as circular, various shapes including rectangular configuration can be used, requiring only that the geometry of the recesses and the depressions are modified into the same shape of the substrate on the susceptor.

Although the invention has been described in a specific embodiment involving the epitaxial deposition of silicon material on monocrystalline silicon substrates, it will be apparent that it is useful for the deposition of any epitaxial material even other than a semiconductor in a radio-frequency heating reactor including the homoepitaxial and heteroepitaxial depositions. Moreover, although the method in accordance with this invention has been described as epitaxial deposition, various depositions including polycrystalline film deposition and amorphous film deposition on monocrystalline substrates can be applied in radio-frequency heating systems, giving no generation of slip lines and dislocations in the substrates.

It has been found that the defects of slip lines and dislocations are generated first in the monocrystalline substrate and then propagate into the deposited layer, so the pattern of these defects is approximately equal with and without the application of an epitaxial layer. Thus, the method in accordance with this invention provides a mean for completely inhibiting the generation of slip lines and dislocations in the monocrystalline substrates, which are subjected to the heat treatment alone at high temperature in radio-frequency heating system.

What is claimed is:

1. A method for inhibiting the generation of slip lines and dislocations completely in an epitaxial film grown by chemical vapor deposition on a semiconductor monocrystalline substrate in a radio-frequency heating reactor by controlling heat flow to the substrate comprising inserting a pad wafer into a flat-bottom recess and over a coaxial flat-bottom depression on a first upper side of the susceptor, coaxially placing the substrate over the pad wafer, epitaxially depositing a film onto the substrate, wherein the pad wafer and susceptor reduce the heat transfer from the pad wafer to the central portions of the substrate and improve the thermal contact between the substrate peripheral edge and the pad wafer, thereby providing a substantial uniform temperature profile across the substrate.

2. The method according to claim 1, wherein the material and dimension of said pad wafers are equal to that of said substrates.

3. The method according to claim 1, wherein the depth of said recesses on the upper side of said susceptor is approximately equal to the sum of the thicknesses of the pad wafer and the substrate.

4. The method according to claim 1, wherein the depth of said depression, for a 3 inch substrate, is from about 0.10 mm to 0.3 mm, and the diameter of said depression is from two thirds to one half the diameter of said substrates.

* * * * *